United States Patent [19]
Nguyen et al.

[11] Patent Number: 5,999,029
[45] Date of Patent: *Dec. 7, 1999

[54] META-HARDENED FLIP-FLOP

[75] Inventors: Hoang P. Nguyen; Richard T. Schultz, both of Fort Collins, Colo.

[73] Assignee: LSI Logic Corporation, Milpitas, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/671,862

[22] Filed: Jun. 28, 1996

[51] Int. Cl.$^6$ .................................................. H03K 3/037
[52] U.S. Cl. .......................... 327/198; 327/219; 327/142; 326/94
[58] Field of Search ...................................... 327/198, 199, 327/218, 225, 219, 208, 211, 212, 202, 203, 141, 142; 326/38, 40, 56–58, 94

[56] References Cited

U.S. PATENT DOCUMENTS

| | | | |
|---|---|---|---|
| 4,093,878 | 6/1978 | paschal et al. | 307/291 |
| 4,963,772 | 10/1990 | Dike | 307/480 |
| 4,999,528 | 3/1991 | Keech | 307/279 |
| 5,014,226 | 5/1991 | Horstmann et al. | 364/551.01 |
| 5,036,221 | 7/1991 | Brucceleri et al. | 307/443 |
| 5,045,801 | 9/1991 | Mowery | 328/72 |
| 5,047,658 | 9/1991 | Shrock et al. | 307/269 |
| 5,118,974 | 6/1992 | Yarbrough et al. | 326/56 |
| 5,140,180 | 8/1992 | Crafts et al. | 307/269 |
| 5,225,723 | 7/1993 | Drako et al. | 326/56 |
| 5,231,313 | 7/1993 | Itoh | 326/56 |
| 5,321,368 | 6/1994 | Hoelzle | 327/199 |
| 5,365,122 | 11/1994 | Rackley | 327/306 |

(List continued on next page.)

FOREIGN PATENT DOCUMENTS

| | | | |
|---|---|---|---|
| 0425275 | 5/1991 | European Pat. Off. | G11C 8/00 |
| 0691741 | 1/1996 | European Pat. Off. | H03K 3/037 |
| 1-241913 | 9/1989 | Japan | 327/202 |
| 3-1608 | 1/1991 | Japan | 327/202 |
| 4-348609 | 12/1992 | Japan | 327/218 |
| 5-29888 | 2/1993 | Japan | 327/218 |
| 5-335899 | 12/1993 | Japan | 327/202 |
| 6-232704 | 8/1994 | Japan | 327/215 |

OTHER PUBLICATIONS

How to Detect Metastability Problems; ASIC Technology; Hoang Nguyen; Feb. 1993.

IBM Technical Disclosure Bulletin; Circuit Scheme to Improve Chip Data Hold Time; vol. 33, No. 7; Dec. 1, 1990; pp. 185–189; XP000108430.

*Primary Examiner*—Timothy P. Callahan
*Assistant Examiner*—Eunja Adolphe

[57] ABSTRACT

A meta-hardened circuit that reduces the effects of metastability preferably includes a pulse generator coupled to receive a first clock signal and generate in response thereto a second clock signal and an enable signal. A buffer, preferably tri-state, is coupled to receive a first data signal and the enable signal and generate in response thereto a second data signal. A bi-stable device, such as a flip-flop, is coupled to receive the second clock signal and the second data signal. The pulse generator preferably includes a combining device and a delay device. The buffer preferably includes at least one tri-state inverter and a keeper circuit. A method to reduce the metastability effects preferably includes the step of generating a delay between a second data input signal and a second clock signal that is greater than a delay between a first data input signal and a first clock signal. The step of generating preferably occurs in one clock cycle. The method also preferably includes generating an enable pulse by generating a second clock signal in response to a first clock signal and combining the first and second clock signals to generate the enable signal, and generating a second data input signal in response to a first data input signal, where generating the second data input signal includes receiving an enable signal. The method preferably includes the step of generating an output signal in response to the second data input signal and the second clock signal, the output signal having a reduced metastable effect.

4 Claims, 6 Drawing Sheets

U.S. PATENT DOCUMENTS

| | | | |
|---|---|---|---|
| 5,391,935 | 2/1995 | Gersbach et al. | 327/198 |
| 5,398,000 | 3/1995 | Wu | 326/9 |
| 5,453,708 | 9/1995 | Gupta | 326/94 |
| 5,463,340 | 10/1995 | Takabatake et al. | 327/203 |
| 5,557,225 | 9/1996 | Denham et al. | 327/218 |
| 5,629,643 | 5/1997 | Moughanni et al. | 327/208 |
| 5,636,165 | 6/1997 | Amatangelo et al. | 327/141 |

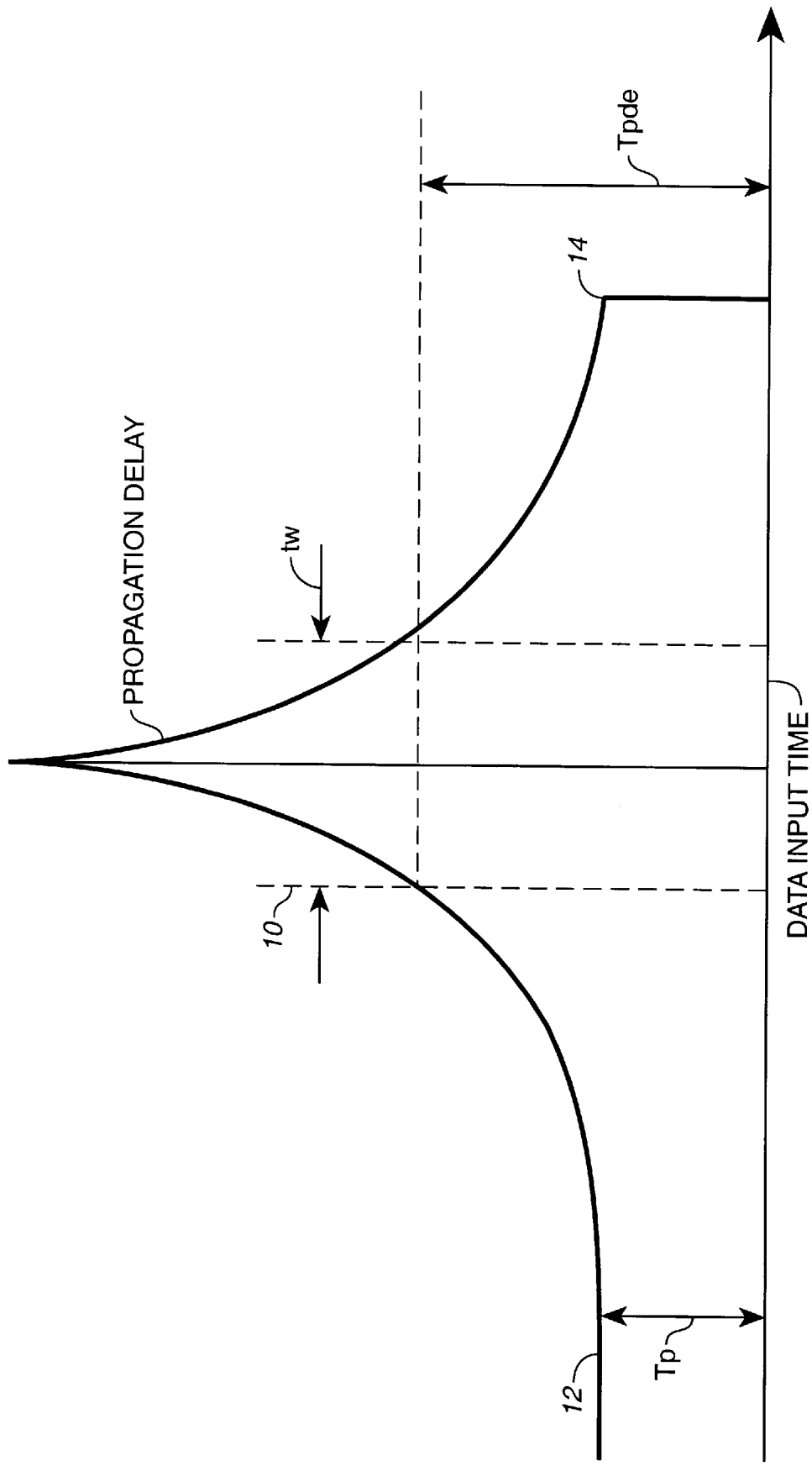
FIG._1

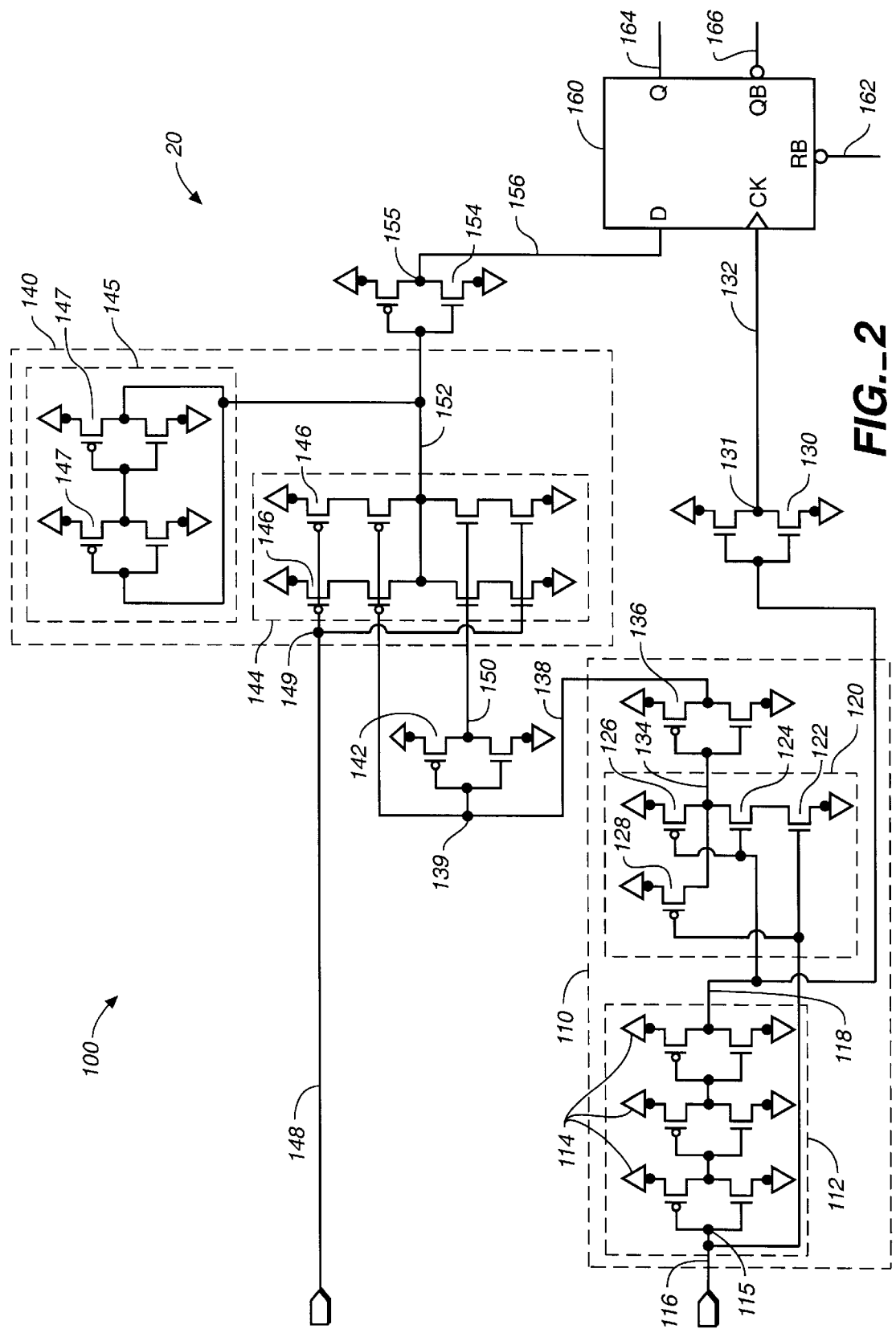
FIG._2

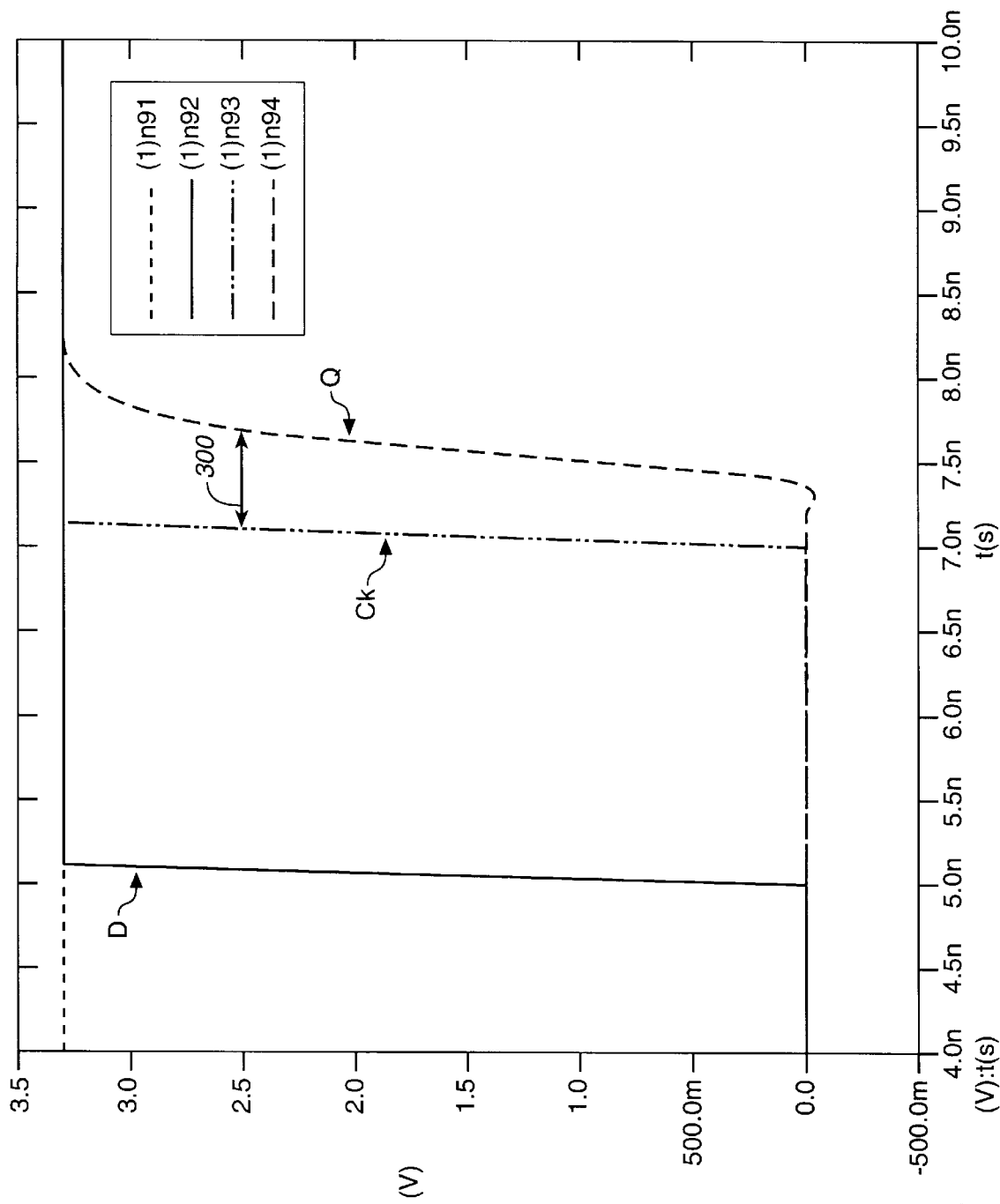
FIG._3
*(PRIOR ART)*

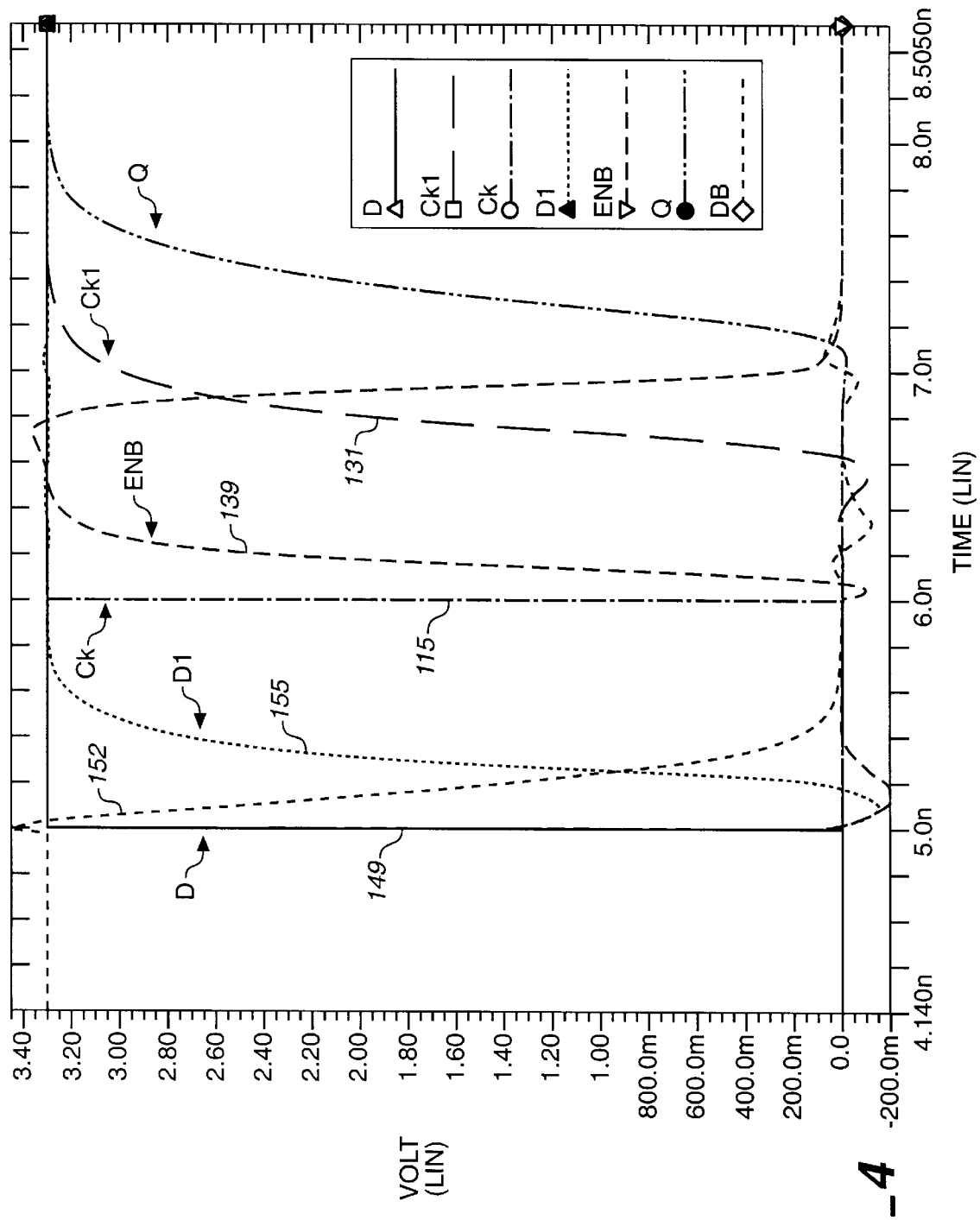
FIG._4

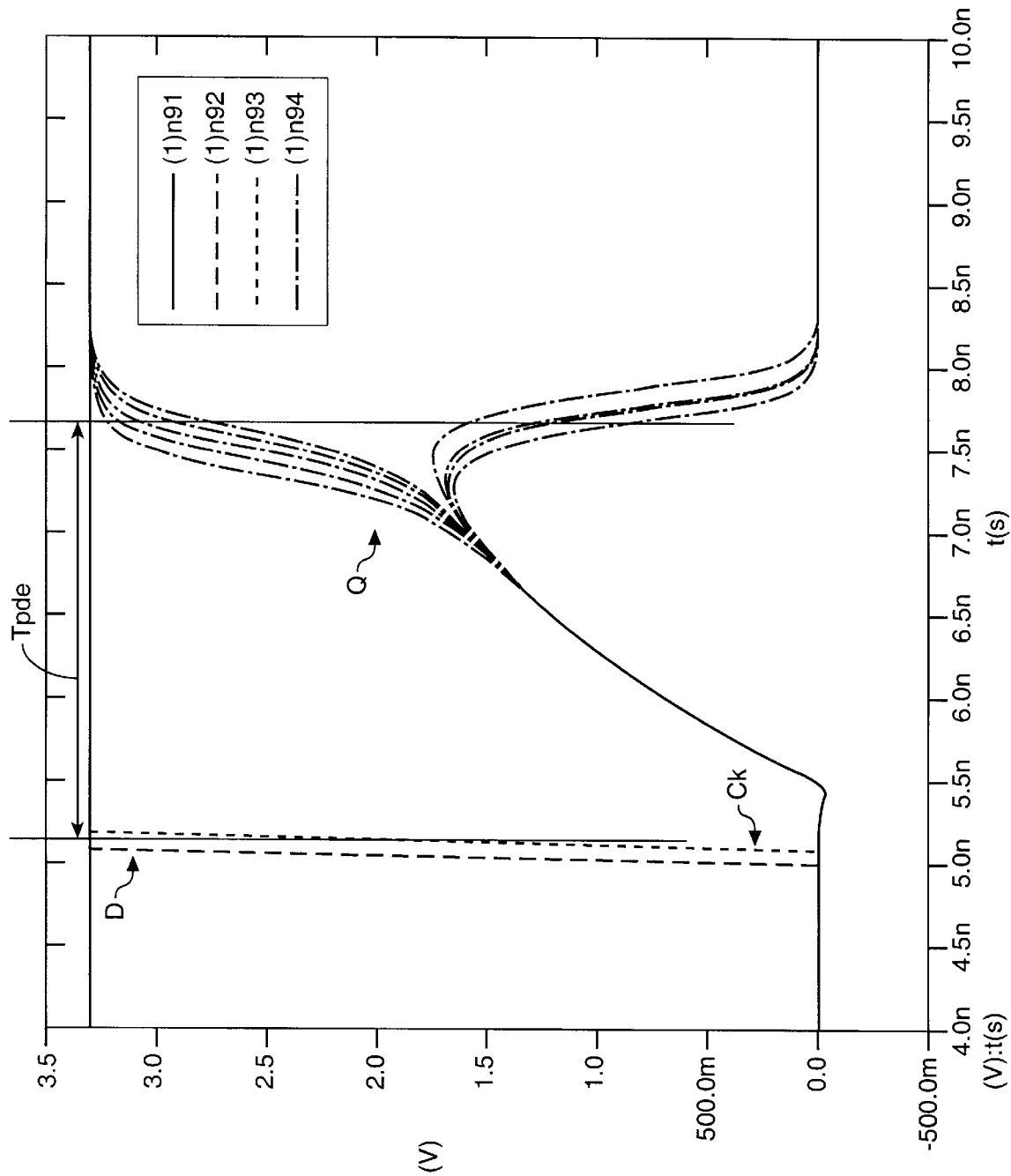
FIG._5

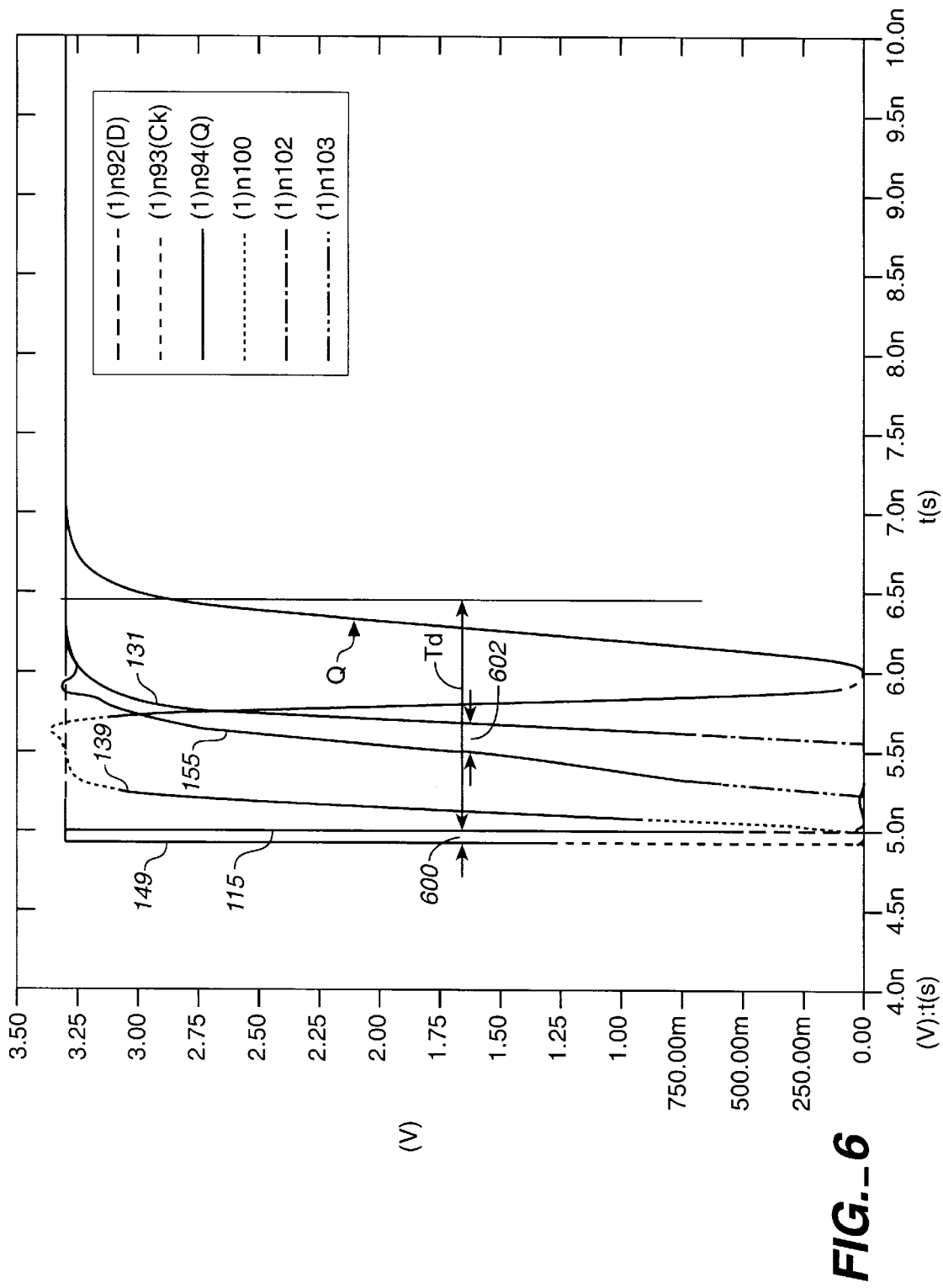
FIG._6

META-HARDENED FLIP-FLOP

FIELD OF THE INVENTION

The present invention relates to synchronizing asynchronous signals and particularly to a meta-hardened circuit for use with a bi-stable latch.

BACKGROUND OF THE INVENTION

Most digital systems have at least one asynchronous input. For example, a computer can have a power-on reset signal, an interrupt signal or a data signal being input at a frequency independent of the system clock. All such systems must synchronize the asynchronous input signal to the system clock before utilizing the input signal.

One method of synchronizing the input signal to a system clock is to use a bi-stable latch or storage element. A flip-flop is one such bi-stable storage element. A conventional flip-flop requires that an input signal, usually a data signal, have a minimal setup time. Setup time is the amount of time the input signal must be stable before the system clock transitions to store the input signal in the flip-flop. The input signal must also remain for a minimal hold time, which is the required time for the output signal of the flip-flop to change state to the value of the input signal.

However, since the input signal is asynchronous to the system clock, an event may occur where either the setup or hold time will be violated. This event causes the output signal of the flip-flop to be an unknown state. Further, the final transition of the flip-flop's output signal may be abnormally delayed. This phenomenon, known as "metastability," can cause errors in other circuits that are coupled to receive the synchronized input signal.

Metastability occurs at a certain time window of the system clock transition. Referring to FIG. 1, the graph shows a flip-flop propagation delay versus a data input timing. The left side of the graph, defined by line 10, shows the input data signal transition occurring well in advance of the setup time and clock transition. This condition causes an output 12 of a flip-flop to become stable after a normal propagation delay $T_p$, as illustrated in FIG. 1.

Metastability occurs in a time window $T_w$. During time window $T_w$, the input data signal transitions within a certain time before or after the transition of the system clock. As a result, output signal 12 is delayed for a time $T_{pde}$. If the input signal violates the hold time, output 12 may not follow the input signal, as shown at 14. For a further discussion, please refer to Hoang Nguyen, *How to Detect Metastability Problems,* ASIC & EDA, February 1993, which is incorporated herein by reference.

As designers push circuit frequencies to 200 MHz, one area of concern is how metastability will affect system reliability. The increasing frequencies have an adverse effect on the mean time between failures (MTBF) due to synchronization failures caused by flip-flop metastability. The MTBF increases exponentially with the clock and data rates. See the referenced article supra.

Various circuit design methods have been used to improve the MTBF of the flip-flop. Such methods include reducing the load at the master transmission gate, or using different types of transmission gates. The improvement gained in the MTBF by using these methods is insignificant. Another method uses two clock cycles, which exacts a time penalty that is disadvantageous for high-speed systems.

A need exists for a flip-flop circuit that reduces the effect of metastability while increasing the MTBF. The present invention meets this need.

SUMMARY OF THE INVENTION

The present invention includes a meta-hardened circuit that reduces the effects of metastability. The meta-hardened circuit preferably includes a pulse generator coupled to receive a first clock signal and generate in response thereto a second clock signal and an enable signal. A buffer, preferably tri-state, is coupled to receive a first data signal and the enable signal and generate in response thereto a second data signal. A bi-stable device, such as a flip-flop, is coupled to receive the second clock signal and the second data signal.

The pulse generator preferably includes a combining device, such as a NAND gate, coupled to receive the first and the second clock signals and to output the enable signal. The pulse generator preferably further includes a delay device, such as an inverter, coupled to receive the first clock signal and generate the second clock signal.

The buffer preferably includes at least one tri-state inverter outputting the second data signal in response to receipt of the first data signal and the enable signal. The tri-state buffer further preferably includes a keeper circuit coupled to maintain the second data signal.

The present invention also includes a method to reduce the metastability effects. The method preferably includes the step of generating a delay between a second data input signal and a second clock signal that is greater than a delay between a first data input signal and a first clock signal. The step of generating preferably occurs in one clock cycle. The method also preferably includes generating an enable pulse by generating a second clock signal in response to a first clock signal and combining the first and second clock signals to generate the enable signal.

The method preferably further includes generating a second data input signal in response to a first data input signal, where generating the second data input signal includes receiving an enable signal. The method preferably includes the step of generating an output signal in response to the second data input signal and the second clock signal, the output signal having a reduced metastable effect.

Numerous other advantages and features of the present invention will become readily apparent from the following detailed description of the invention and the embodiments thereof, from the claims and from the accompanying drawings in which details of the invention are fully and completely disclosed as a part of this specification.

BRIEF DESCRIPTION OF THE DRAWINGS

In the drawings,

FIG. 1 is a graph of flip-flop output propagation delay versus data input timing;

FIG. 2 is a schematic diagram of a meta-hardened circuit according to the present invention;

FIG. 3 is a waveform diagram for a conventional flip-flop in a normal region;

FIG. 4 is a waveform diagram of a meta-hardened flip-flop utilizing the present invention in a normal region;

FIG. 5 is a waveform diagram for a conventional flip-flop in a metastable region; and FIG. 6 is a waveform diagram of a meta-hardened flip-flop utilizing the present invention in a metastable region.

DETAILED DESCRIPTION OF THE PREFERRED EMBODIMENT

While this invention is susceptible of embodiment in many different forms, there is shown in the drawings and will be described herein in detail a specific embodiment thereof with the understanding that the present disclosure is to be considered as an exemplification of the principles of the invention and is not to be limited to the specific embodiment described.

FIG. 2 shows a meta-hardened flip-flop 20 according to the present invention. Meta-hardened flip-flop 20 includes a meta-hardened circuit 100 and a flip-flop 160. Although flip-flop 160 is a functionally conventional D-type flip-flop, other bi-stable latches or storage elements can be used.

Meta-hardened circuit 100 includes a pulse generator 110 and a tri-state input buffer 140. Pulse generator 110 includes a delay circuit 112 coupled to a combiner circuit 120. Delay circuit 112 preferably includes three inverters 114 that are coupled to a node 115 which receives a first clock signal from a lead 116. A delayed inverted or second clock signal is generated by delay circuit 112 and output onto lead 118.

As preferred and illustrated in FIG. 2, combiner circuit 120 includes n-channel transistors 122, 124 and p-channel transistors 126, 128 coupled together to form a two-input logic NAND gate. Combiner circuit 120 is coupled to receive both the first clock signal and the delayed inverted or second clock signal via respective leads 116 and 118 as inputs to the NAND gate. Combiner circuit 120 provides an enable signal on a lead 134 which is a pulse having a width that corresponds to the time delay between the transition of the first clock signal and the delayed inverted or second clock signal. Lead 134 provides the enable signal to inverter 136, where it is inverted and output on a lead 138 to a node 139. Node 139 is coupled to inverters 136, 142 and tri-state input buffer 140 via lead 138. Combiner circuit 120 includes arithmetic or Boolean functions.

Lead 118 provides the delayed inverted or second clock signal to an inverter 130. Inverter 130 inverts the second clock signal and outputs it to a node 131 as a flip-flop clock signal. Node 131 provides the flip-flop clock signal on a lead 132.

Tri-state input buffer 140 includes a tri-state inverter circuit 144 coupled to a keeper circuit 145. Tri-state inverter circuit 144 preferably includes two tri-state inverters 146. Tri-state inverters 146 are coupled to receive a data input signal from a lead 148 via a node 149, and an inverted enable signal (pulse) and its complement on leads 138 and 150, respectively.

An inverted or second data input signal that is output from tri-state inverter circuit is provided on a lead 152 to keeper circuit 145 and an inverter 154. Keeper circuit 145 preferably includes two long-channel length inverters 147. A first inverter 147 is coupled to receive the inverted data input signal via lead 152 and to provide an inverted output to a second inverter 147. Second inverter 147 outputs a delayed inverted data signal onto lead 152, which maintains a voltage of the inverted or second data input signal at node 152. Inverter 154 provides a delayed or flip-flop data signal on a lead 156 via anode 155.

A data input D of flip-flop 160 is coupled to node 155 via lead 156 to receive the delayed or flip-flop data signal. A clock input CK of flip-flop 160 is coupled to node 131 via lead 132 to receive the flip-flop clock signal. A reset input RB of flip-flop 160 is coupled to receive a reset signal via a lead 162. The reset signal is asynchronous to the first clock signal and preferably is active low.

Flip-flop 160 provides signals from outputs Q and QB on respective leads 164 and 166 in response to the second data, second clock and reset signals. Flip-flop 160 is illustrated as a D flip-flop with reset and positive edge triggered, such as a flip-flop designated as DFFRP available from a Symbios Logic Inc. standard cell library.

Inverters 114, 130, 136, 142, 147 and 154 each include a p-channel and an n-channel transistor. Inverters 147 each include two p-channel and two n-channel transistors. Meta-hardened flip-flop 20 preferably is coupled to a 3.3 V power supply and to a ground, as known in the art.

The operation of meta-hardened flip-flop 20 can best be explained with reference to FIGS. 3–6. Referring to FIG. 3, the normal operation of a flip-flop without metastability protection will be explained. A data input signal D begins to transition from low to high at 5 ns. A clock signal CK begins to transition from low to high at 7 ns. An output signal Q begins to transition at about 7.3 ns in response to the data input and clock signals. A delay 300 of about 0.676 ns is realized.

The normal operation of meta hardened flip-flop 20 that provides a normal output delay will be explained with reference to FIG. 4. A voltage at node 149, which corresponds to an input data signal, transitions from low to high at 5 ns. A voltage on lead 152 transitions from high to low which causes a delayed or flip-flop data signal voltage at node 155 to transition from low to high.

A voltage at node 115 that corresponds to the first clock signal transitions from low to high at 6 ns. In response to the transition of node 115 voltage, a positive (enable) pulse voltage is generated at node 139 that has a pulse width of approximately 0.76 ns. The voltage at node 139 enables the tri-state inverter circuit 144 to enter a tri-state mode. In this mode, tri-state inverter circuit 144 will not allow a voltage on lead 152 from transitioning in response to a transition of the data input signal on lead 148. Keeper circuit 145 maintains the voltage on lead 152 low, which maintains the flip-flop data signal voltage at node 155 voltage high. Keeper circuit 145 functions to prevent the voltage on lead 152 from floating when tri-state inverter circuit 144 is in the tri-state mode.

A flip-flop clock signal voltage at node 131, which is a delayed first clock signal of about 0.81 ns, transitions from low to high at approximately 6.64 ns. Flip-flop 160, in response to receiving the voltages at nodes 155 and 131, transitions the Q output on lead 164 from low to high at approximately 7.1 ns.

Referring to FIG. 5 and Table 1, a metastable state of a conventional D flip-flop will be explained. Table 1 records simulation values for a conventional D flip-flop. From the values of Table 1, the Q output of the flip-flop is in a metastable region when the setup time is less than or equal to 200 ps. Thus, the time window value tw equals 200 ns −84 ns=116 ns. The simulated flip-flop of Table 1 had a simulated load of 0.11 pf, a Vdd of 3.3V, a clock period minus setup time of 9.8 ns, a data input frequency of 25 MHz and a clock frequency of 100 MHz. The MTBF is approximately 3.664× $10^{43}$ for the simulated flip-flop.

TABLE 1

| Setup time (ps) | Propagation Delay (ns) | Normal delay/Metastable delay |
|---|---|---|
| 2000.00 | 0.676192 | normal delay |
| 200.00 | 0.764884 | metastable delay |
| 100.00 | 0.851794 | metastable delay |
| 86.00 | 1.380982 | metastable delay |
| 84.00 | 1.885511 | metastable delay |
| 84.929 | 1.979923 | metastable delay |
| 84.828 | 2.301044 | metastable delay |
| 84.82804 | 2.415904 | metastable delay |

FIG. 5 illustrates a metastable region for the flip-flop where the setup value is approximately 83 ps and the propagation delay time $T_{pde}$ is approximately 2.375 ns. The propagation delay time $T_{pde}$ is calculated from when the clock signal CK reaches 1.65 V and the Q output reaches 2.8 V.

The same parameters were used for simulating a meta-hardened flip-flop according to the present invention. Referring to Table 2 below, the normal propagation delay is increased to approximately 1.49 ns due to the delay of the first clock signal at node 131. However, the extended or propagation delay time $T_{pde}$ for the meta-hardened flip-flop is approximately 1.53 ns versus the approximate 2.41 ns delay for the conventional flip-flop represented in FIG. 5. The MTBF for the meta-hardened flip-flop of the present invention is approximately $4.896 \times 10^{67}$, an increase of better than $10^{24}$ times over the conventional flip-flop. The simulation recorded in Table 2 utilized a settling time (clock period—setup time) of 9.7075 ns.

TABLE 2

| Setup time (ps) | Propagation Delay (ns) | Normal delay/Metastable delay |
|---|---|---|
| 2000.00 | 1.490523 | normal delay |
| 200.00 | 1.490523 | normal delay |
| 193.00 | 1.522691 | metastable delay |
| 191.600 | 1.530775 | metastable delay |
| 191.46 | 1.530745 | metastable delay |
| 191.4446 | 1.531733 | metastable delay |
| 191.44446 | 1.531855 | metastable delay |
| 191.444446 | 1.531851 | metastable delay |

FIG. 6 illustrates a metastable region for the meta-hardened flip-flop of the present invention. At approximately 4.94 ns, a voltage at node 149, representing the input data signal, transitions from low to high. At approximately 5 ns, a voltage at node 115 that represents the first clock signal transitions from low to high. At approximately 5 ns also, the voltage at node 139, corresponding to the enable signal, transitions from low to high.

At approximately 5.25 ns, a voltage representing the flip-flop data input signal at node 155 transitions from low to high. A voltage at node 131 that represents the flip-flop clock signal transitions from low to high at approximately 5.56 ns. The Q output of D flip-flop 160 transitions from low to high at approximately 6 ns. The setup time for the input data signal is approximately 83 ps and the propagation delay time $T_d$ is approximately 1.44 ns, much less than the 2.41 ns delay experienced by the conventional D flip-flop of FIG. 5. The propagation delay time $T_d$ is calculated from when the clock signal CK reaches 1.65 V and the Q output reaches 2.8 V.

As shown in FIG. 6, meta-hardened circuit 100 provides to flip-flop 160 a data signal on lead 156 that has a setup time defined by 602. The setup time 602 is approximately twice the setup time 600 for the first data input signal. In other words, meta-hardened circuit 100 increases the setup time between data signal and clock inputs to a flip-flop. This increase is accomplished in only one clock cycle.

The present invention has numerous advantages. As shown in Table 2, the propagation delay converges to a value of approximately 1.5 ns, whereas the flip-flop without meta-stability protection converges to a value over 2.41 ns. This reduced delay lessens the effects of metastability.

Numerous variations and modifications of the embodiment described above may be effected without departing from the spirit and scope of the novel features of the invention. For example, a negative edge triggered flip-flop needs a NOR gate in place of the NAND gate of combiner circuit 120.

It is to be understood that no limitations with respect to the specific device illustrated herein are intended or should be inferred. It is, of course, intended to cover by the appended claims all such modifications as fall within the scope of the claims.

We claim:

1. A circuit that reduces the effects of metastability of an asynchronous latch circuit comprising:

a pulse generator coupled to receive a first clock signal and that generates a pulse at a predetermined time and delays said first clock signal by a first predetermined amount; and a tri-state buffer coupled to receive a first data signal and said pulse that generates a second data signal that is prevented from transitioning for a predetermined period after said predetermined time and that delays said first data signal by a second predetermined amount that is greater than said first predetermined amount, wherein the second data signal is coupled to the asynchronous latch circuit.

2. The circuit of claim 1 wherein said tri-state buffer includes at least one tri-state inverter that is disabled by said pulse and a keeper circuit that maintains the output of said tri-state inverter.

3. A method of reducing metastable effects that are produced in a circuit that receives an input clock signal and an input data signal asynchronously and which are separated by a setup time comprising the steps of:

generating a pulse during a predetermined time window;

preventing a transition of a data signal that is applied to a latch during said predetermined time window by providing a tri-state buffer that enters a tri-state condition and a keeper circuit that maintains the output of said tri-state buffer prior to said tri-state buffer entering said tri-state condition; and generating a delay between the data signal applied to said latch and a clock signal applied to said latch that reduces metastability, said delay being greater than said setup time between said input data signal and said input clock signal.

4. The method of claim 3 further comprising the step of generating the clock signal that is applied to said latch and that is delayed from said input clock signal so that said tri-state buffer enters said tri-state condition and said output of said tri-state buffer is maintained before said clock signal is applied to said latch.

* * * * *